United States Patent [19]

Dippon et al.

[11] Patent Number: 6,004,619
[45] Date of Patent: Dec. 21, 1999

[54] PROCESS FOR MANUFACTURING PRINTED CIRCUIT BOARDS

[75] Inventors: Siegfrid Dippon, Gechingen; Walter Olbrich, Magstadt, both of Germany

[73] Assignee: Hewlett-Packard Company, Palo Alto, Calif.

[21] Appl. No.: 08/965,853

[22] Filed: Nov. 7, 1997

[30] Foreign Application Priority Data

Nov. 7, 1996 [DE] Germany ............................ 196 45 854

[51] Int. Cl.⁶ ........................................................ B05D 5/12
[52] U.S. Cl. ........................ 427/97; 427/99; 427/124; 427/282; 427/300; 427/405
[58] Field of Search .............................. 427/97, 99, 124, 427/282, 300, 554, 405

[56] References Cited

U.S. PATENT DOCUMENTS 3,628,999  12/1971  Schneble, Jr. et al. ................. 117/212
4,603,799   8/1986  Gurol ........................................ 427/97

FOREIGN PATENT DOCUMENTS 0260514   3/1988  European Pat. Off. .
0677985  10/1995  European Pat. Off. .
 677985  10/1995  European Pat. Off. .

Primary Examiner—Brian K. Talbot

[57] ABSTRACT

Process for manufacturing circuit boards in which a masking layer (2) is applied to a carrier substrate (1) of insulating material and after producing openings for soldering pads, conductor traces, and through or blind holes, in accordance with a preferred embodiment by laser ablation, a thin electrically conductive layer (5) is applied to the surface of the carrier substrate including the masking layer. Subsequently, the masking layer (2) and the conductive layer deposited thereon, for example copper, are removed and the remaining metal surfaces (6) are chemically reinforced to produce the desired thickness. The process permits the production of dense structures using few process steps and without additional abrasion steps.

9 Claims, 1 Drawing Sheet

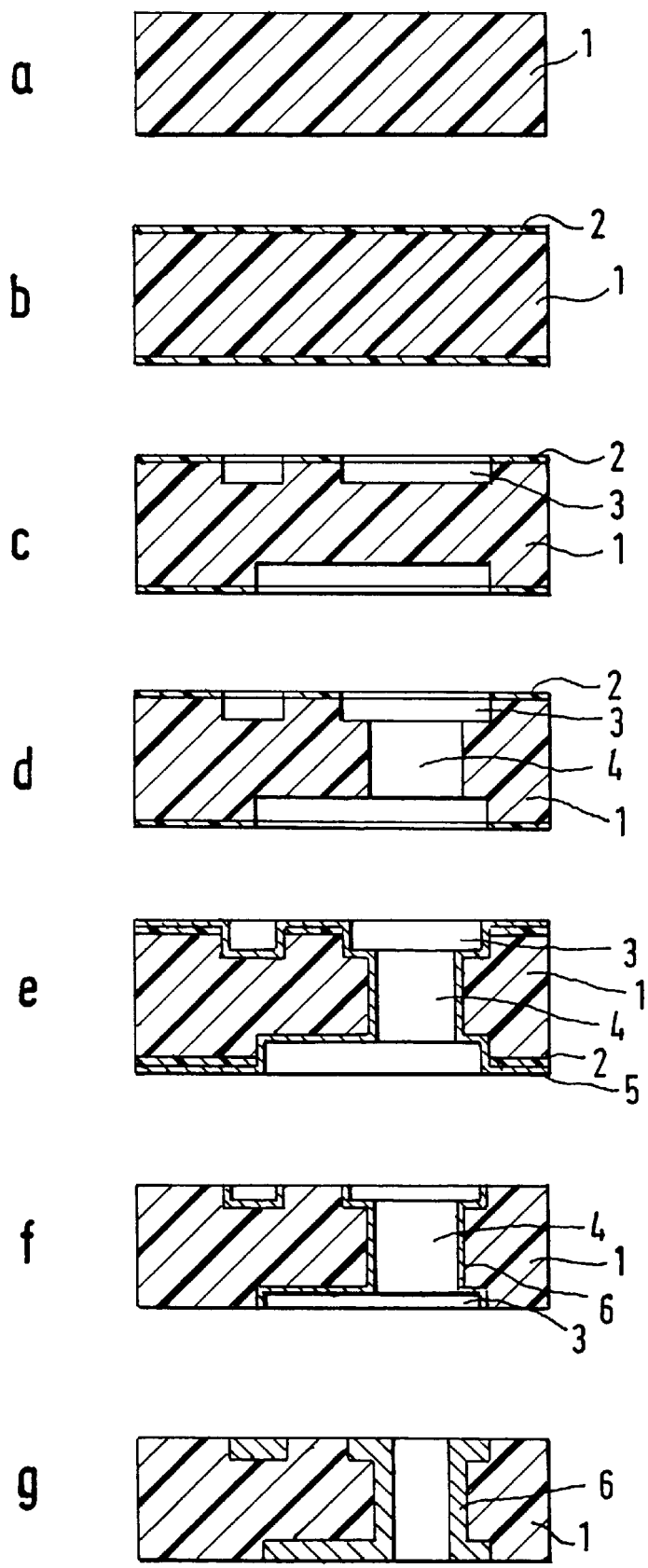

PROCESS FOR MANUFACTURING PRINTED CIRCUIT BOARDS

DESCRIPTION

The present invention relates to a process for manufacturing printed circuit boards in which metallic conductive structures and holes are produced by laser ablation on a substrate of insulating material in accordance with a desired pattern.

In EP 0 677 985 A1, a process is disclosed in which conductor traces and through holes are produced in a carrier substrate of insulating material by laser ablation. In this known process, after generation of the holes and conductor traces in the carrier substrate, a thin metal layer is deposited over the entire surface of the carrier substrate. Subsequently, chemical deposition of an additional metal layer is performed to provide the desired thickness. The surface is then removed by abrasion such that only the metallized through holes and conductor traces or soldering pads remain. The abrasion in itself represents a relatively crude mechanical process that adversely affects the carrier material and the environment as well. Furthermore, a large portion of the applied metal layers is irrecoverably lost.

The object of the present invention therefore is to suggest an approach that eliminates the cited disadvantages.

This object is fulfilled in the present invention by the characteristics of the main claim. Further advantageous embodiments can be ascertained from the subclaims.

In accordance with the invention, a masking layer is applied to an insulating carrier substrate, such as a film. The masking layer can consist of a thin resist either in liquid form or in solid form as a film. Subsequently, recessed structures are produced in the masking layer and in the upper region of the carrier substrate, for example for the soldering pads, conductor traces, and/or through holes or blind holes. The production of the recessed structures and the through or blind holes in the previously prepared recesses for soldering pads is performed by laser ablation, for example. A thin conductive layer is applied over the entire surface of the carrier substrate and thus also on the masking layer, for example by PVD (physical vapor deposition), PCVD (plasma enhanced vapor deposition), or other metallization processes. In one embodiment, the thickness of the conductive layer, such as copper, is approx. 20 nm to 1000 nm. Then, the masking layer including the electrically conductive material deposited thereon is removed in a conventional manner, whereby the material remains in the locations on the carrier substrate not covered by the masking layer. Finally, the remaining thin structures of the conductive material are chemically reinforced such that the final thickness of the material (copper) is approx. 5 to 50 µm.

Compared to the known processes, this process has the advantage that a large number of high-density structures can be easily produced in a few process steps, providing a simple, inexpensive material. Furthermore, when the masking layer and the conductive layer deposited thereon are removed, only a small amount of material is irrevocably lost.

To produce a multi-layer circuit board, a carrier substrate as used for the starting material of the first layer is laminated onto at least one side of a conventional circuit board or one produced in accordance with the invention, and the aforementioned process steps are carried out. In a multi-layer circuit board in particular, blind holes will be required.

In the following, the invention is described in more detail on the basis of an embodiment example in conjunction with the sole figure.

FIGS. A through G show the process of the invention for producing two layers on both sides of a carrier substrate 1. In accordance with FIG. A, a film made of a dielectric material such as polyimide, polyester, epoxy, thermount, or liquid crystal polymer is used as the starting material. The thickness is preferably between 15 µm and 80 µm.

FIG. B shows a masking layer 2 applied to both sides of the carrier material 1. The masking layer can be a thin resist either in liquid form or in solid form as a film.

FIG. C shows carrier substrate 1 and the masking layer 2 with engraved openings 3, which as a result of laser ablation extend into carrier substrate 1 to a defined depth, such as 20 µm. In this step, both the masking material and the carrier material are ablated. Subsequently, in accordance with FIGURE c, the through holes 4 are produced by laser ablation in the region of the previously opened masking layer 2. FIG. E shows a metal layer 5 deposited, for example using PVD/PCVD processes, on the entire surface of carrier substrate 1.

In FIG. F, the masking material with the metal layer applied thereon has been removed such that the metal remains in the locations not covered by the masking layer. Subsequently, metal is deposited on the remaining conductive structures 6, in the example copper, for example by chemical metal deposition or a galvanic process, to obtain a layer thickness of approx. 5 to 50 µm.

The circuit board produced in this manner can now be used as starting material for a multi-layer circuit board, whereby carrier substrates 1 as in FIGURE a are again laminated onto both sides of the initial circuit board and the previously described steps are repeated.

We claim:

1. Process of manufacturing printed circuit boards, comprising the following steps:

a) applying a masking layer to an insulating carrier substrate, b) then producing recesses in the masking layer and in an upper region of the carrier substrate for at least one of (i) soldering pads, (ii) conductor traces and (iii) through holes in the masking layer and the carrier substrate, c) then applying a conductive layer to the surface of the carrier substrate while the masking layer is in situ on the carrier substrate so that the conductive layer is applied to the masking layer and recesses, d) then removing the masking layer with the conductive layer applied thereon without removing the conductive layer from the recesses so that a residual portion of the conductive layer remains in the recesses, and e) then applying metal to the residual portion of the conductive layer to attain a thicker residual portion.

2. Process in accordance with claim 1, characterized in that, to produce a multi-layer circuit board, a carrier substrate is laminated onto at least one side of a standard circuit board or the circuit board produced in accordance with claim 1, and process steps a) through e) are carried out.

3. Process in accordance with claim 1, characterized in that the recessed structures are produced by laser ablation.

4. Process in accordance with claim 1, characterized in that the recesses in the upper region of the carrier substrate in accordance with step b) have a depth of approximately 20 μm.

5. Process in accordance with claim 1, characterized in that application of the conductive layer is performed by physical vapor deposition or plasma enhanced vapor deposition processes.

6. Process in accordance with claim 2, characterized in that the recessed structures are produced by laser ablation.

7. Process in accordance with claim 6, characterized in that the structure depth in the upper region of the carrier substrate in accordance with step b) is approximately 20 μm.

8. Process in accordance with claim 7, characterized in that application of the conductive layer is performed by physical vapor deposition or plasma enhanced vapor deposition processes.

9. Process in accordance with claim 1, wherein the conductive layer is applied, the masking layer is removed and the metal is applied to the residual portion of the conductive layer so that all exposed portions of the soldering pads of through holes and the conductor traces remaining on the carrier substrate after the masking layer has been removed are substantially coplanar.

* * * * *